United States Patent
Lee

[11] Patent Number: 5,998,958
[45] Date of Patent: Dec. 7, 1999

[54] METHOD FOR ESTIMATING RESISTANCE VALUES OF STATOR AND ROTOR OF INDUCTION MOTOR

[75] Inventor: Sang-hoon Lee, Sungnam, Rep. of Korea

[73] Assignee: Samsung Electronics Co., Ltd., Rep. of Korea

[21] Appl. No.: 09/229,962

[22] Filed: Jan. 14, 1999

[30] Foreign Application Priority Data

May 26, 1998 [KR]  Rep. of Korea ...................... 98-19049

[51] Int. Cl.⁶ ................................................. G01R 27/00
[52] U.S. Cl. ........................................... 318/801; 324/525
[58] Field of Search .................................. 318/798–801, 318/804, 805, 807, 812, 814; 324/525

[56] References Cited

U.S. PATENT DOCUMENTS

| | | | |
|---|---|---|---|
| 4,039,907 | 8/1977 | Marsh et al. ............................ | 318/135 |
| 4,442,393 | 4/1984 | Abbondanti ............................. | 318/802 |
| 5,861,728 | 1/1999 | Tazawa et al. ......................... | 318/778 |

*Primary Examiner*—Bentsu Ro
*Attorney, Agent, or Firm*—Burns, Doane, Swecker & Mathis LLP

[57] ABSTRACT

The resistance values of a stator and a rotor of an induction motor are estimated through the steps of (a) checking whether a control system of the induction motor reaches a normal state, (b) measuring normal state values of the values necessary for estimating resistance values of a stator and a rotor when the control system reaches a normal state, (c) estimating a stator resistance value based on the measured normal state values, (d) applying an AC component to a magnetic flux command input to the control system and calculating a first variable for estimating rotor resistance, (e) obtaining an AC component with respect to each variable by allowing the calculated first variable to pass through a band pass filter, (f) calculating a second variable for estimating rotor resistance based on the AC component with respect to the respective variables obtained above, and (g) estimating rotor resistance using the calculated second variable. Thus, since a stator resistance is estimated based on the condition of the generated torque at the time of estimating resistance of the induction motor and the rotor resistance is estimated through the AC component included in the current and voltage of the stator, the resistance values of the stator and the rotor which vary during the operation of the induction motor can be accurately estimated.

10 Claims, 3 Drawing Sheets

METHOD FOR ESTIMATING RESISTANCE VALUES OF STATOR AND ROTOR OF INDUCTION MOTOR

BACKGROUND OF THE INVENTION

1. Field of the Invention

The present invention relates to a method for estimating resistance values of a stator and a rotor of an induction motor, and more particularly, to a method for estimating, accurately and in real time, the change of resistance values of a stator and a rotor of an induction motor due to an increase in temperature during operation of the induction motor.

2. Description of the Related Art

The speed controlling method of an induction motor can be a voltage controlling type, a frequency controlling type, or an electromagnetic coupling type. The voltage controlling type method controls the speed of an induction motor by changing the voltage applied to the induction motor using a reactor or thyristor, which is divided into a Scherbius type and a Kramer type. The Scherbius type method is further divided into a motor-generator controlling type and an inverter controlling type.

In the motor-generator controlling type method, a secondary output of a wound-rotor type induction motor is rectified by a silicon rectifier into direct current and the output is supplied to a DC motor. The DC motor drives an induction generator and electricity generated by the induction generator returns to power. Thus, the motor-generator controlling method controls the speed of the induction motor through field magnet control of the DC motor.

According to the inverter controlling type method, a secondary output of a wound-rotor type induction motor is rectified by a silicon rectifier into direct current. The direct current is converted by a thyristor inverter into a three-phase alternating current, and the alternating current returns to power. That is, the inverter controlling type method controls the speed of the induction motor by phase-shifting the inverter.

One of the parameters affecting the speed control of an induction motor as above is a resistance component. That is, as temperature increases according to a prolonged operation of the induction motor, resistance values of a stator and a rotor of the induction motor vary and accordingly current values applied to the stator and the rotor change so that accuracy in speed control of a control system of the induction motor is lowered. Conventionally, to overcome the above problems, the resistance values of the stator and the rotor are estimated to be used in speed controlling.

FIG. 1 is a view schematically showing the structure of a system for estimating resistance values of a stator and a rotor of an induction motor which is adopted to a conventional method for estimating resistance values of a stator and a rotor of an induction motor.

Referring to FIG. 1, a system 100 for estimating resistance values of a stator and a rotor of an induction motor according to the conventional technology includes an all-dimension observation apparatus 101 for obtaining estimated values of current and magnetic flux, a speed estimating portion 102 for estimating is rotational speed utilizing an estimated value of magnetic flux obtained by the all-dimension observation apparatus 101 and the difference between the estimated value of current and actual current, and a motor constant estimating portion 103 for estimating resistance values of a stator and a rotor of an induction motor based on the values obtained by the all-dimension observation apparatus 101 and the speed estimating portion 102. Here, the above constituents are not common hardware comprising electrical parts or circuit elements but imaginary constituents presented as apparatuses to help in the understanding of an algorithm existing in a software of a computer system.

According to the conventional system for estimating resistance values of a stator and a rotor having the above structure, the voltage vector $V_s$ and current vector $i_s$ of the voltage applied to the stator during driving of the induction motor are measured and an estimated value $\hat{i}_s$ of current of the stator and an estimated value $\hat{\Phi}_r$ of magnetic flux of the rotor are obtained based on the above measured values. Here, the estimated value $\hat{i}_s$ of current and the estimated value $\hat{\Phi}_r$ of magnetic flux are obtained by the following Equation (1).

$$\frac{d}{dt}\begin{bmatrix}\hat{i}_s\\\hat{\phi}_r\end{bmatrix} = A\begin{bmatrix}\hat{i}_s\\\hat{\phi}_r\end{bmatrix} + BV_s + G(i_s - \hat{i}_s) \tag{1}$$

Here, A and B having a relationship of $A \in R^{4\times 4}$ and $B \in R^{4\times 2}$ represent a system matrix of the induction motor and G having a relationship of $G \in R^{4\times 2}$ represents a gain matrix of the observation apparatus.

When the estimated value $\hat{i}_s$ of current and the estimated value $\hat{\Phi}_r$ of magnetic flux are obtained as above, the rotation speed is estimated by the speed estimating portion 102 using the estimated value $\hat{\Phi}_r$ of magnetic flux and the difference $(i_s - \hat{i}_s)$ between the actual current $i_s$ and the estimated value $\hat{i}_s$ of current. Here, the speed estimation value is obtained by the following Equation (2).

$$\hat{\omega}_r = \left(K_p + \frac{K_i}{s}\right)\{\hat{\phi}_r \cdot (i_s - \hat{i}_s)\} \tag{2}$$

Here, $\hat{\omega}_r$, $K_p$, $K_i$ and s represent speed estimate value, proportional constant, integral constant and Laplace operator, respectively.

When the speed estimate value $\hat{\omega}$ is obtained as above, resistance values of the stator and the rotor are estimated after applying an AC component to the magnetic flux current of the induction motor by the motor constant estimating portion 103. Here, the estimated values of resistance of the stator and the rotor are obtained by the following Equation (3).

$$\hat{R}_s = \left(K_{p1} + \frac{K_{i1}}{s}\right)\{\hat{i}_s \cdot (i_s - \hat{i}_s)\}, \tag{3}$$

$$\hat{R}_r = L_r\left(K_{p2} + \frac{K_{i2}}{s}\right)\{\hat{\phi}_r \cdot (\hat{\phi}_r - M\hat{i}_s)\}$$

Here, $\hat{R}_s$, $\hat{R}_r$, $L_r$, and M represent the estimated value of resistance of the stator, the estimated value of resistance of the rotor, inductance of the rotor, and mutual inductance, respectively. Also, $K_{p1}$ and $K_{p2}$ represent proportional constants and $K_{i1}$ and $K_{i2}$ represent integral constants.

However, the estimated value diverges in the case in which the induction motor operates in a generator mode. Also, the conventional method lacks general usability since it is applicable only when an estimation apparatus of a MRAS (model reference adaptive system) type of a sensorless speed control system is employed.

SUMMARY OF THE INVENTION

To solve the above problem, it is an objective of the present invention to provide a method for estimating resistance values of a stator and a rotor of an induction motor so that change in the resistance values of the stator and the rotor can be accurately estimated in real time regardless of load-torque.

Accordingly, to achieve the above objective, there is provided a method for estimating resistance values of a stator and a rotor of an induction motor which comprises the steps of, (a) checking whether a control system of the induction motor reaches a normal state, (b) measuring normal state values of the values necessary for estimating resistance values of a stator and a rotor when the control system reaches a normal state, (c) estimating a stator resistance value based on the measured normal state values, (d) applying an AC component to a magnetic flux command input to the control system and calculating a first variable for estimating rotor resistance, (e) obtaining an AC component with respect to each variable by allowing the calculated first variable to pass through a band pass filter, (f) calculating a second variable for estimating rotor resistance based on the AC component with respect to the respective variables obtained above, and (g) estimating rotor resistance using the calculated second variable.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
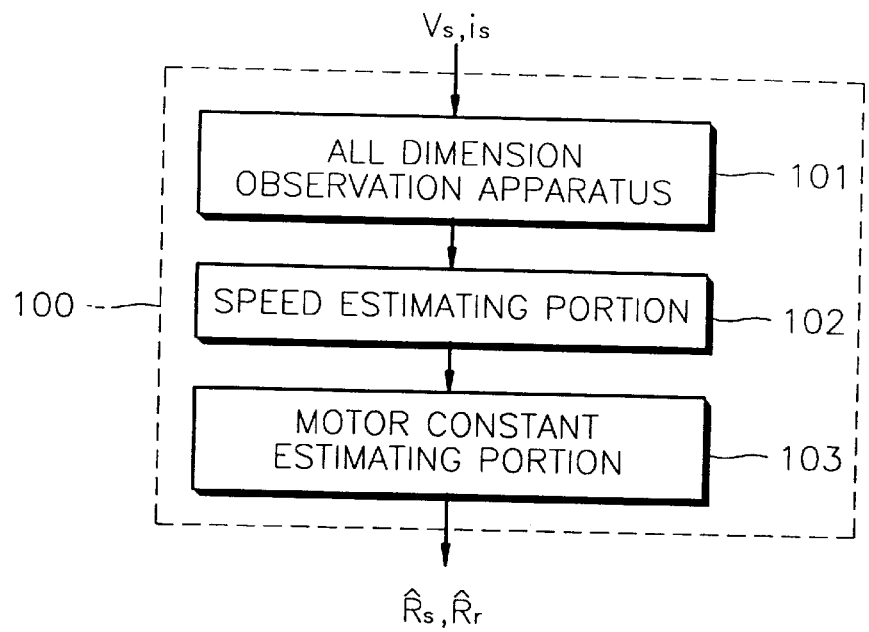
FIG. 1 is a view schematically showing the structure of a system for estimating resistance values of a stator and a rotor of an induction motor which is adopted to a conventional method for estimating resistance values of a stator and a rotor of an induction motor.
Figure 2:
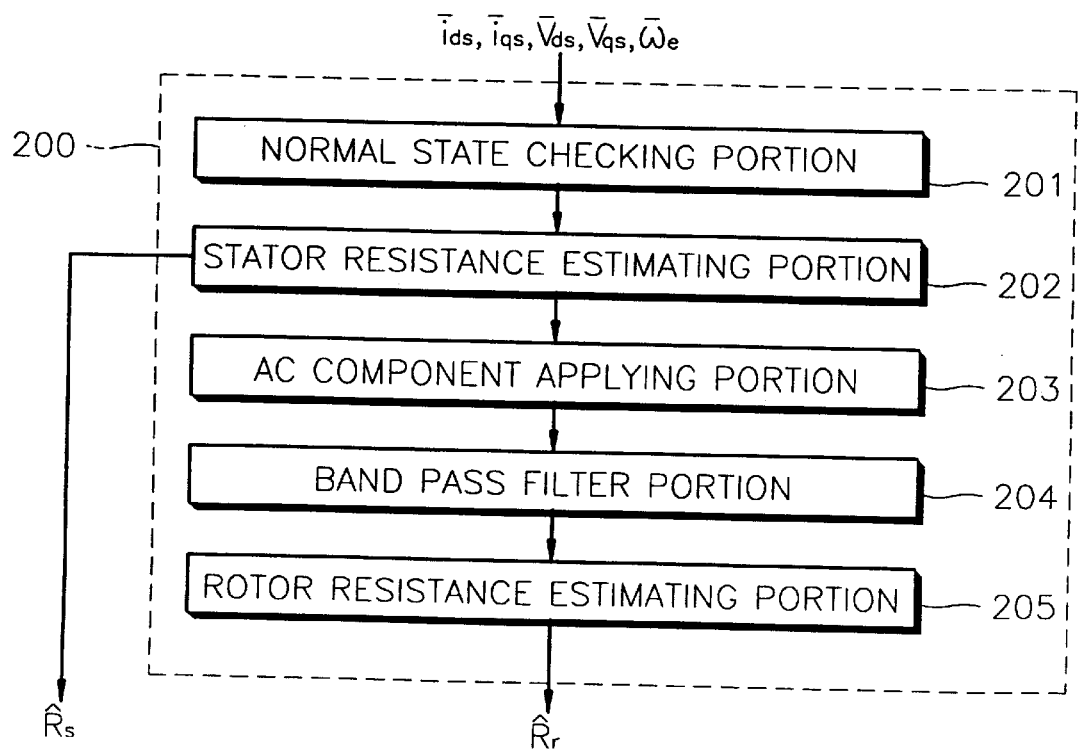
FIG. 2 is a view schematically showing the structure of a system for estimating resistance values of a stator and a rotor of an induction motor which is adopted to a method for estimating resistance values of a stator and a rotor of an induction motor according to the present invention.

Referring to FIG. 2, a system 200 for estimating resistance values of a stator and a rotor of an induction motor adopted to a method for estimating resistance values of a stator and a rotor of an induction motor according to the present invention includes a normal state checking portion 201 for checking whether a control system 304 (refer to FIG. 3) of the induction motor is in a normal state or not, a stator's resistance estimating portion 202 for estimating a resistance value of the stator using current, voltage, rotation speed of a control shaft, and generated torque when the control system 304 of the induction motor is in a normal state, an AC component applying portion 203 for applying an AC component to a magnetic flux command or a magnetic flux current of the control system 304 of the induction motor, a band pass filter portion 204 for extracting the AC component included in the current, voltage and rotation speed of a control shaft of the induction motor, and a rotor resistance estimating portion 205 for estimating the resistance value of the rotor using the AC component included in the current, voltage and rotation speed of a control shaft of the induction motor.

Here, as described previously, the above constituents are not common hardware comprising electrical parts or circuit elements but imaginary constituents presented as apparatuses to help in the understanding of an algorithm existing in a software of a computer system.

Figure 3:
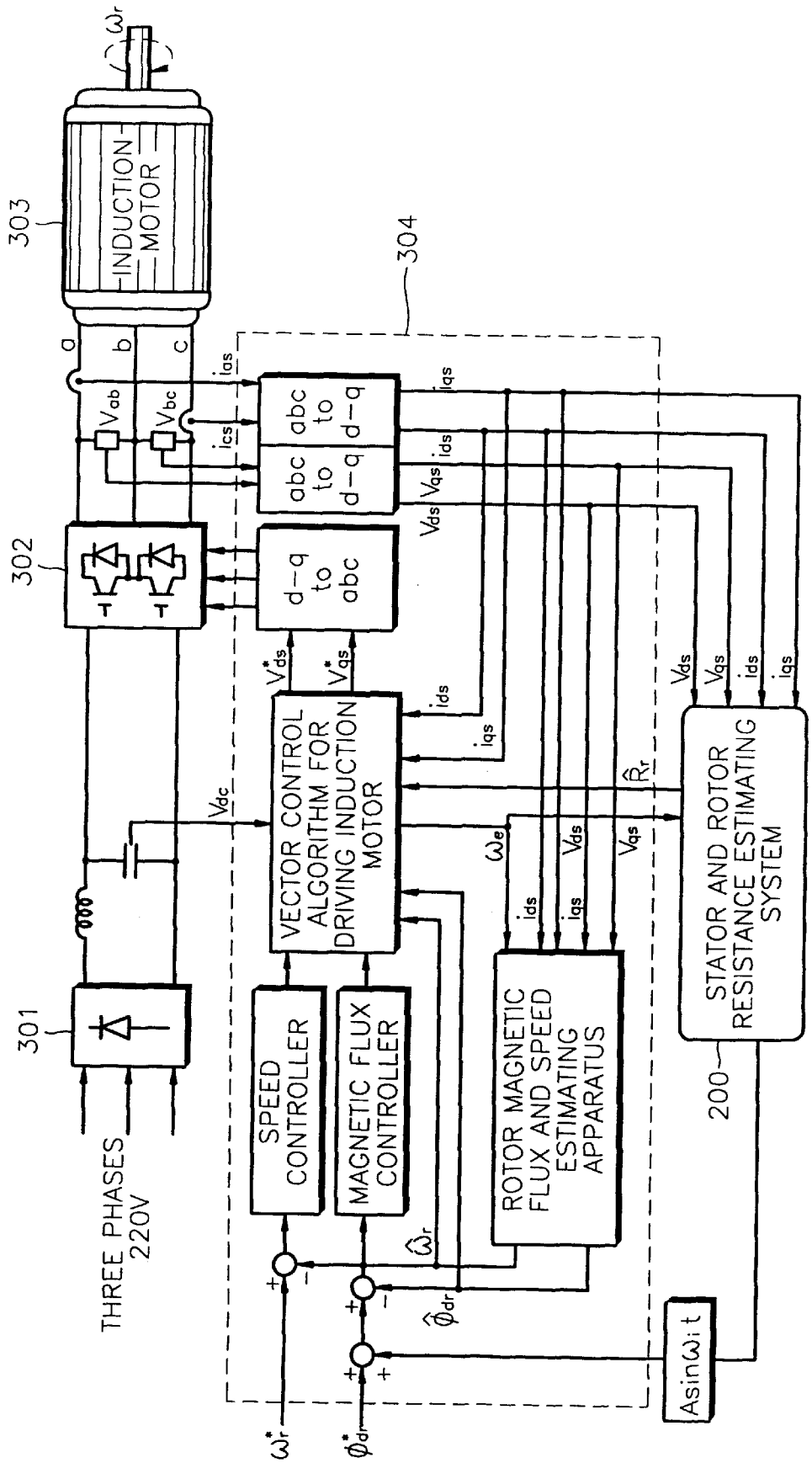
FIG. 3 is a view schematically showing the structure of a sensorless speed control system employing the estimation system shown in FIG. 2.

The system 200 for estimating a resistance value of a stator and a rotor of an induction motor having the above structure is used for controlling the speed of the induction motor by being adopted in the sensorless speed control system 304 of an induction motor as shown in FIG. 3. In FIG. 3, reference numerals 301, 302 and 303 represent a rectifier, a switching unit, and an induction motor, respectively.

Hereinafter, a process of estimating resistance values of the stator and the rotor using the system for estimating resistance values of a stator and a rotor of an induction motor having the above structure will be described with reference to FIGS. 2 through 4.

Figure 4:
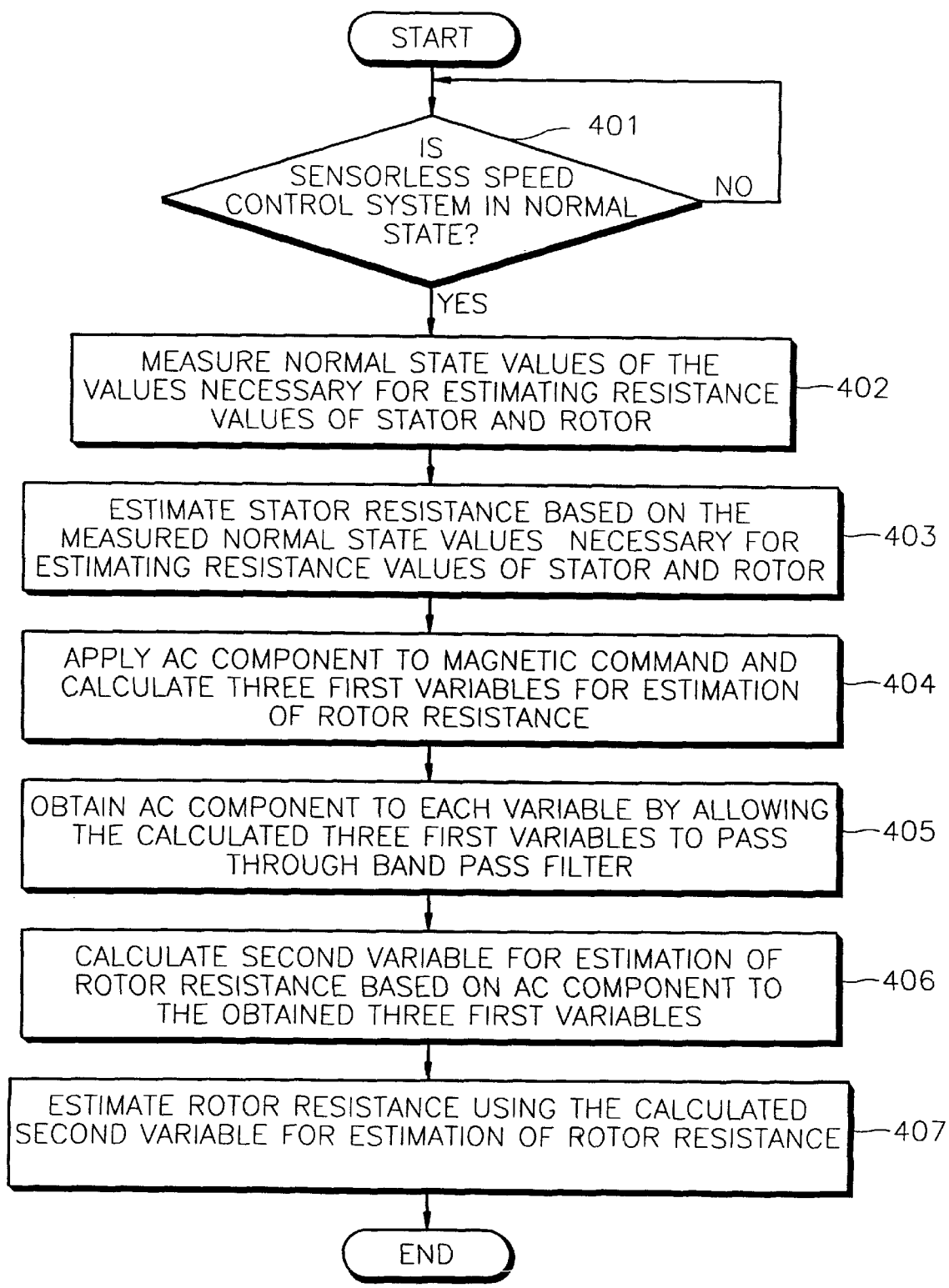
FIG. 4 is a flow chart showing the method for estimating resistance values of a stator and a rotor of an induction motor according to the present invention.

Referring to FIGS. 2 through 4, according to the method for estimating resistance values of a stator and a rotor of an induction motor according to the present invention, the normal state checking portion 201 checks whether the sensorless speed control system 304 of the induction motor 303 reaches a normal state (step 401). Here, a speed command $\omega_r^*$ and a magnetic flux command $\Phi_{dr}^*$ of the sensorless speed control system 304 are maintained as constants.

When the sensorless speed control system 304 is checked in step 401 as not having reached a normal state, step 401 is repeated. When the sensorless speed control system 304 reaches a normal state, values in a normal state of the values necessary for estimating resistance values of a stator and a rotor are measured (step 402). That is, normal state values $\overline{\omega}_e$, $\overline{i}_{ds}$, $\overline{i}_{qs}$, $\overline{E}_d$, and $\overline{E}_q$ with respect to rotation speed $\omega_e$ of a control shaft, current $i_{ds}$ and $i_{qs}$ of the stator of shafts d and q, and voltage $E_d(t)$ and $E_q(t)$ of the shafts d and q indicated by time parametric functions, respectively, are estimated. Here, $E_d(t)$ and $E_q(t)$ are is obtained by the following Equation (4).

$$E_d(t) = dt/d\ i_{ds}(t) - \omega_e(t)i_{qs}(t) + a_0 \hat{R}_s i_{ds}(t) - a_0 V_{ds}(t) \quad (4)$$

$$E_q(t) = dt/d\ i_{qs}(t) + \omega_e(t)i_{ds}(t) + a_0 \hat{R}_s i_{qs}(t) - a_0 V_{qs}(t)$$

Here, $a_0$ is a function of motor constant and $a_0 = 1/\sigma L_s$, and $V_{ds}$ and $V_{qs}$ represent the stators voltage of shafts d and q, respectively.

When the values in a normal state of the values necessary for estimating resistance values of a stator and a rotor are measured, a stator resistance value is estimated by the stator resistance estimating portion 202 based on the measured values (step 403). Here, the estimated stator resistance value $\hat{R}_s$ is obtained by the following Equation (5).

$$R_1 = \left(P - \frac{2}{3p} K_T \overline{\omega}_e \sqrt{D_r}\right) / |I|^2 \quad (5)$$

$$R_2 = \left(P + \frac{2}{3p} K_T \overline{\omega}_e \sqrt{D_r}\right) / |I|^2$$

Here, $$D_r \equiv \{Ma_3\overline{\omega}_e|I|^2 - (a_0Q - \overline{\omega}_e|I|^2)\}\frac{(a_0Q - \overline{\omega}_e|I|^2)}{|a_3\overline{\omega}_e|^2},$$

$K_T$ represents a torque constant, $P \equiv V_{ds}i_{ds} + V_{qs}i_{qs}$, $$I \equiv \sqrt{i_{ds}^2 + i_{qs}^2},$$

$Q \equiv V_{qs}i_{ds} - V_{ds}i_{qs}$, $a_3 = a_0 M/L_r$ wherein $a_3$ represents a function of a motor constant, and p represents a polarity logarithm that is expressed as (the number of polarity in a motor)/2. The equivalent sign "≡" signifies "to be deemed as . . . ", which is slightly different from the equal sign "=".

That is, according to a load condition in Equation (5), for example, when the generated torque at the time of estimation is positive, $R_1$ is set to an estimated value of stator resistance $\hat{R}_s$, and when the generated torque is negative, $R_2$ is set to $\hat{R}_s$.

When the stator resistance is estimated as above, an AC component is applied to magnetic flux command $\Phi_{dr}^*$ by the AC component applying portion 203 and three first variables for estimating rotor resistance are calculated (step 404). That is, an AC component, $\Delta\Phi_{dr}^* = A \sin \omega_i t$, is applied to the magnetic flux $\Phi_{dr}^*$ to include the AC component in the magnetic flux of the rotor. Here, the amount of the applied AC component A is 5% of the amount of rated magnetic flux and frequency $\omega_i$ applies a low frequency of 1–5 Hz with an amount different from that of the rotation speed of the control shaft. The three first variables $\alpha(t)$, $\beta(t)$, and $\gamma(t)$ are calculated by the following Equation (6) in a state in which the AC component is applied to the magnetic flux as above.

$\alpha(t) \equiv \{\overline{E}_d \omega_e(t)/a_3\overline{\omega}_e\} - E_d(t)/a_3$  (6)

$\beta(t) \equiv \{\overline{E}_q \omega_e(t)/a_3\overline{\omega}_e\} - E_q(t)/a_3$ $\gamma(t) \equiv \{-\overline{E}_q i_{ds}(t) + \overline{E}_d i_{qs}(t)\}/a_3\overline{\omega}_e$ When the three first variables $\alpha(t)$, $\beta(t)$, and $\gamma(t)$ are calculated as above, the three first variables $\alpha(t)$, $\beta(t)$, and $\gamma(t)$ are allowed to pass through the band pass filter portion 204 to obtain AC components $\Delta\alpha_H$, $\Delta\beta_H$, and $\Delta\gamma_H$ with respect to each variable (step 405). Here, when a band pass filter of the band pass filter portion 204 is set to $H_{BP}(s)$, $H_{BP}(s)$ can be expressed as the following Equation (7).

$$H_{BP}(s) = \frac{|\omega_L|^2}{s^2 + (\omega_L/Q_L)s + |\omega_L|^2} \times \frac{(\omega_i/Q)s}{s^2 + (\omega_i/Q)s + |\omega_i|^2} \quad (7)$$

Here, $\omega_i$ is a central frequency, $\omega_L$ is a low frequency, Q and $Q_L$ are quality factors, and $\omega_L \gg \omega_i$.

When the AC components $\Delta\alpha_H$, $\Delta\beta_H$, and $\Delta\gamma_H$ to the respective three first variables are obtained as above, second variables $\Delta x_H$ and $\Delta y_H$ to estimate rotor resistance are calculated based on the obtained AC components (step 406). Here, the second variables $\Delta x_H$ and $\Delta y_H$ are obtained by the following Equation (8).

$\Delta x_H = -(2\overline{E}_q + Ma_3\overline{\omega}_e i_{ds})(\Delta\dot{\alpha}_H + \overline{\omega}_e\Delta\beta_H)/\{a_3\overline{\omega}_e(|\overline{\omega}_e|^2 + |\omega_i|^2)\} + (2\overline{E}_d - Ma_3\overline{\omega}_e i_{qs})(\Delta\dot{\beta}_H - \overline{\omega}_e\Delta\alpha_H)/\{a_3\overline{\omega}_e(|\overline{\omega}_e|^2 + |\omega_i|^2)\} + M\Delta\gamma_H$ (8)

$$\Delta y_H = L_r \frac{-\overline{E}_q(|\omega_i|^2\Delta\alpha_H - \overline{\omega}_e\Delta\dot{\beta}_H) + \overline{E}_d(|\omega_i|^2\Delta\beta_H + \overline{\omega}_e\Delta\dot{\alpha}_H)}{a_3\overline{\omega}_e(|\overline{\omega}_e|^2 + |\omega_i|^2)}$$

Here, $\Delta\dot{\alpha}_H$ and $\Delta\dot{\beta}_H$ indicate differential values to $\Delta\alpha_H$ and $\Delta\beta_H$, respectively.

When the second variables $\Delta x_H$ and $\Delta y_H$ to estimate rotor resistance are obtained as above, the rotor resistance is estimated by the rotor resistance estimating portion 205 using the variables $\Delta x_H$ and $\Delta y_H$ (step 407). Here, the estimated value for rotor resistance $\hat{R}_r$ is obtained by the following Equation (9).

$$\hat{R}_r = \frac{|\Delta y_H|}{|\Delta x_H|} \quad (9)$$

The estimated value of stator resistance $\hat{R}_s$ and the estimated value of rotor resistance $\hat{R}_r$ are obtained as above and the obtained values are reflected to the sensorless speed control system 304 to be used in controlling speed of the induction motor 303.

As described above, in the method for estimating resistance values of a stator and a rotor of an induction motor according to the present invention, since a stator resistance is estimated based on the condition of the generated torque at the time of estimating resistance of the induction motor and the rotor resistance is estimated through the AC component included in the current and voltage of the stator, the resistance values of the stator and the rotor which vary during the operation of the induction motor can be accurately estimated.

Therefore, the resistance values of a stator and a rotor can be accurately estimated in a state of no-load or operation of an induction motor in a generator mode. Also, the method has general usability since it can be applied regardless of the type of control and estimating algorithm used for sensorless controlling of the induction motor. Further, contrary to the conventional sensorless speed control system which estimates stator and rotor resistance in a state in which operation is stopped, in the present invention, the stator and rotor resistance is estimated in real time during operation so that accuracy and reliability in speed control of a sensorless speed control system can be improved.

What is claimed is:

1. A method for estimating resistance values of a stator and a rotor of an induction motor comprising the steps of:

(a) checking whether a control system of said induction motor reaches a normal state;

(b) measuring normal state values of the values necessary for estimating resistance values of a stator and a rotor when said control system reaches a normal state;

(c) estimating a stator resistance value based on the measured normal state values;

(d) applying an AC component to a magnetic flux command input to said control system and calculating a first variable for estimating rotor resistance;

(e) obtaining an AC component with respect to each variable by allowing the calculated first variable to pass through a band pass filter;

(f) calculating a second variable for estimating rotor resistance based on the AC component with respect to the respective variables obtained above; and (g) estimating rotor resistance using the calculated second variable.

2. The method as claimed in claim 1, wherein the measurement of the normal state values in said step (b) is to measure normal state values $\overline{\omega}_e$, $\overline{i}_{ds}$, $\hat{i}_{qs}$, $\overline{E}_d$, and $\overline{E}_q$ with respect to rotation speed $\omega_e$ of a control shaft, current $i_{ds}$ and $i_{qs}$ of the stator of shafts d and q, and voltage $E_d(t)$ and $E_q(t)$ of the shafts d and q indicated by time parametric functions, respectively.

3. The method as claimed in claim 2, wherein said voltage $E_d(t)$ and $E_q(t)$ of the shafts d and q indicated by time parametric functions are obtained by the following equations, $$E_d(t) \equiv dt/d\ i_{ds}(t) - \omega_e(t)\ i_{qs}(t) + a_0 \hat{R}_s i_{ds}(t) - a_0 V_{ds}(t)$$

$$E_q(t) \equiv dt/d\ i_{qs}(t) + \omega_e(t) i_{ds}(t) + a_0 \hat{R}_s i_{qs}(t) - a_0 V_{qs}(t),$$

wherein $a_0$ as a function of a motor constant is expressed by $a_0 = 1/\sigma L_s$, and $V_{ds}$ and $V_{qs}$ represent voltage of the stator of the shafts d and q, respectively, and the equivalent sign "≡" signifies "to be deemed as", which is slightly different from the equal sign "=".

4. The method as claimed in claim 1, wherein said estimated stator resistance value $\hat{R}_s$ in said step (c) is obtained by the following equation, $$R_1 = \left(P - \frac{2}{3p} K_T \overline{\omega}_e \sqrt{D_r}\right) / |I|^2$$

$$R_2 = \left(P + \frac{2}{3p} K_T \overline{\omega}_e \sqrt{D_r}\right) / |I|^2,$$

wherein $$D_r \equiv \{Ma_3\overline{\omega}_e|I|^2 - (a_0 Q - \overline{\omega}_e|I|^2)\} \frac{(a_0 Q - \overline{\omega}_e |I|^2)}{|a_3 \overline{\omega}_e|^2},$$

$K_T$ represents a torque constant, $P \equiv V_{ds} i_{ds} + V_{qs} i_{qs}$, $$I \equiv \sqrt{i_{ds}^2 + i_{qs}^2},$$

$Q \equiv V_{qs} i_{ds} - V_{ds} i_{qs}$, $a_3 = a_0 M/L_r$ wherein $a_3$ represents a function of a motor constant, and p represents a polarity logarithm that is expressed as (the number of polarity in a motor)/2.

5. The method as claimed in claim 4, wherein, when the generated torque at the time of estimation is positive, $R_1$ is set to an estimated value of stator resistance $\overline{R}_s$, and when the generated torque is negative, $R_2$ is set to $\hat{R}_s$.

6. The method as claimed in claim 1, wherein the amount of the AC component applied to the magnetic flux command in said step (d) is 5% of the amount of rated magnetic flux and a low frequency of 1–5 Hz is applied with an amount different from that of the rotation speed of the control shaft.

7. The method as claimed in claim 1, wherein, assuming that the first variables for estimating rotor resistance in said step (d) are $\alpha(t)$, $\beta(t)$, and $\gamma(t)$, the first variables are calculated by the following equations, $$\alpha(t) \equiv \{\overline{E}_d \omega_e(t)/a_3 \overline{\omega}_e\} - E_d(t)/a_3$$

$$\beta(t) \equiv \{\overline{E}_q \omega_e(t)/a_3 \overline{\omega}_e\} - E_q(t)/a_3$$

$$\gamma(t) \equiv \{-\overline{E}_q i_{ds}(t) + \overline{E}_d i_{qs}(t)\}/a_3 \overline{\omega}_e.$$

8. The method as claimed in claim 1, wherein, assuming that the band pass filter in said step (e) is $H_{BP}(s)$, $H_{BP}(s)$ is obtained by the following equation, $$H_{BP}(s) = \frac{|\omega_L|^2}{s^2 + (\omega_L/Q_L)s + |\omega_L|^2} \times \frac{(\omega_i/Q)s}{s^2 + (\omega_i/Q)s + |\omega_i|^2},$$

wherein $\omega_L \gg \omega_i$ and $Q$ and $Q_L$ indicate quality factors.

9. The method as claimed in claim 1, wherein, assuming that the second variables for estimating rotor resistance in said step (f) are $\Delta x_H$ and $\Delta y_H$, the second variables $\Delta x_H$ and $\Delta y_H$ are obtained by the following equation, $$\Delta x_H = -(2\overline{E}_q + Ma_3 \overline{\omega}_e \overline{i}_{ds})(\Delta \dot{\alpha}_H + \overline{\omega}_e \Delta \beta_H)/\{a_3 \overline{\omega}_e(|\overline{\omega}_e|^2 + |\omega_i|^2)\} + (2\overline{E}_d - Ma_3 \overline{\omega}_e \overline{i}_{qs})(\Delta \dot{\beta}_H - \overline{\omega}_e \Delta \alpha_H)/\{a_3 \overline{\omega}_e(|\overline{\omega}_e|^2 + |\omega_i|^2)\} + M\Delta \gamma_H$$

$$\Delta y_H = L_r \frac{-\overline{E}_q(|\omega_i|^2 \Delta \alpha_H - \overline{\omega}_e \Delta \dot{\beta}_H) + \overline{E}_d(|\omega_i|^2 \Delta \beta_H + \overline{\omega}_e \Delta \dot{\alpha}_H)}{a_3 \overline{\omega}_e(|\overline{\omega}_e|^2 + |\omega_i|^2)},$$

wherein $\Delta \alpha_H$, $\Delta \beta_H$, and $\Delta \gamma_H$ indicate AC components with respect to the respective three first variables and $\Delta \dot{\alpha}_H$ and $\Delta \dot{\beta}_H$ are differential values with respect to $\Delta \alpha_H$ and $\Delta \beta_H$, respectively.

10. The method as claimed in claim 1, wherein the estimated value $\hat{R}_r$ for rotor resistance in said step (g) is obtained by the following equation, $$\hat{R}_r = \frac{|\Delta y_H|}{|\Delta x_H|}.$$

* * * * *